United States Patent
Long et al.

(10) Patent No.: US 7,239,516 B2
(45) Date of Patent: Jul. 3, 2007

(54) FLEXURE PLATE FOR MAINTAINING CONTACT BETWEEN A COOLING PLATE/HEAT SINK AND A MICROCHIP

(75) Inventors: David C. Long, Wappingers Falls, NY (US); Glenn G. Daves, Fishkill, NY (US); David L. Edwards, Poughkeepsie, NY (US); Ronald L. Hering, Pleasant Valley, NY (US); Sushumna Iruvanti, Wappingers Falls, NY (US); Kenneth C. Marston, Wappingers Falls, NY (US); Jason S. Miller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 10/939,230

(22) Filed: Sep. 10, 2004

(65) Prior Publication Data
US 2006/0056156 A1   Mar. 16, 2006

(51) Int. Cl.
H05K 7/20 (2006.01)
(52) U.S. Cl. ...................... 361/704; 257/719; 361/710; 361/719
(58) Field of Classification Search ........ 257/718–719; 361/719–720
See application file for complete search history.

(56) References Cited

U.S. PATENT DOCUMENTS

| | | | |
|---|---|---|---|
| 4,449,155 A | 5/1984 | Meier et al. | |
| 5,933,293 A | 8/1999 | Bennin | |
| 6,088,202 A | 7/2000 | Kabasawa et al. | |
| 6,205,026 B1 * | 3/2001 | Wong et al. | 361/704 |
| 6,219,239 B1 * | 4/2001 | Mellberg et al. | 361/704 |
| 6,556,443 B1 * | 4/2003 | Wei | 361/704 |
| 6,667,885 B2 * | 12/2003 | Malone et al. | 361/700 |
| 6,952,348 B2 * | 10/2005 | Wu | 361/719 |
| 2005/0007743 A1 * | 1/2005 | Eckblad et al. | 361/719 |

* cited by examiner

*Primary Examiner*—Greg Thompsopn
(74) *Attorney, Agent, or Firm*—DeLio & Peterson, LLC; Robert Curcio; James J. Cioffi

(57) ABSTRACT

A flexible plate for securing a microchip surface to the surface of a cooling device. The flexible plate allows for z-directional movement between the microchip subassembly having a circuit board and a semiconductor substrate, and the cooling device. The flexible plate is a compact, single piece design that provides constraints in alignment in the x-, y-, and theta-directions, while allowing for z-direction compliance and tilt compliance. The flexible plate has tabs for mounting the microchip subassembly and tabs for mounting the cooling device. The microchip tabs are opposite one another and the cooling device mounting tabs are opposite one another. The flexible plate is a one-piece construction made from sheet metal, plastic, or metal castings. The flexible plate has a band with all the tabs mounted on the inside of the band, or one set of tabs mounted on the outside of the band.

21 Claims, 6 Drawing Sheets

FLEXURE PLATE FOR MAINTAINING CONTACT BETWEEN A COOLING PLATE/HEAT SINK AND A MICROCHIP

BACKGROUND OF THE INVENTION

1. Field of the Invention

This invention relates to the assembly of systems using semiconductor devices. Specifically, this invention relates to maintaining thermal efficiency between a microchip and a heat sink or cooling plate used to transport thermal energy away from the microchip. More specifically, the invention is directed to a flexible mounting plate that holds the microchip against a heat sink or cold plate while allowing the tandem to have z-direction movement without degrading the thermal bond between them.

2. Description of Related Art

In high performance computers, removal of heat from microchips is very important and critical to the proper operation of the microchips and ultimately to the successful operation of the system. Efficient heat removal is achieved by maintaining intimate thermal contact between a cooling plate or heat sink and a microchip during system assembly and throughout the product's lifecycle.

However, difficulties arise in maintaining constant contact between a heat sink or cooling plate and the microchips on a semiconductor substrate throughout the assembly process and the subsequent operation of the system during its lifetime. Importantly, the specifications for the cooling solutions require that thermal contact be maintained throughout the product life cycle, which may include ensuring contact under shock and vibration amplitudes on the order of 50 g. FIG. 1 illustrates a microchip/heat sink bond design of the prior art using spring mounting screws 32 for attaching a heat sink plate 34 to the printed circuit board 38, and pressing the pedestal 12 of the heat sink 30 against the microchip 36. The microchip is mounted on a semiconductor substrate 40 that is electrically attached to the printed circuit board 38 via solder balls 42.

A detriment of the prior art is that the mechanical structure of FIG. 1 creates a statically indeterminate situation where contact pressure between the microchip and a heat sink or cold plate becomes unknown, and is subject to excessive variability. Moreover, the design is prone to friction, stiction, and mechanical binding between screws 32 and clearance holes 35. The prior art design's variability is in all directions. Flexibility remains important to the mounting design, ensuring constant contact while under vibration and shock induced forces. The current prior art designs do not account or allow for this flexibility, and rely instead on a rigid configuration to ensure contact. In providing a rigid support, the prior art yields to separation forces that tend to move the microchip relative to the cooling device in x-, y-, and z-directions. Moreover, the current designs are prone to mounting screw binding due to the nature of the screws 32 and clearance holes 35. This binding or friction alters the interface pressure from optimum design criteria and creates a statically indeterminate mechanical design. The friction may also change over time and cause interface pressure changes.

Thus, for mechanical strength and reliability, the interface pressure between the microchip and the cooling plate or heat sink must be closely controlled. A typical required pressure is approximately in the range of 25 to 250 psi for a microchip mounted to a semiconductor substrate and the substrate mounted to a circuit board using solder balls. Thermal paste or grease 29 is used at the heat sink/microchip interface to maximize the heat flow. Once the heat sink, microchip, and thermal paste are forced together at 25 to 250 psi, the excess paste will extend outwards from the joining faces. In this position, the contacting surfaces should not be disturbed through rocking, twisting, sliding, or other separation forces. If the interface is disturbed, thermal performance is degraded, which may result in microchip overheating.

One solution has been to enlarge the holes 35 in the cooling plate or heat sink mounting plate 34 to eliminate potential binding and friction. Enlarged holes are preferred over straight bushings since they are less likely to cause binding when subjected to non-centered forces. They can also alleviate binding caused by slightly tilted posts. However, by doing this, the ability to accurately locate the heat sink 30 in the x-, y-, and theta-directions is compromised. Location accuracy in this plane is needed to prevent any sliding movement of the cooling device during thermal cycling, shock, and vibration environments.

Bearing in mind the problems and deficiencies of the prior art, it is therefore an object of the present invention to provide an apparatus to secure a microchip to a cold plate or heat sink that will allow for component fitness variations and tilt, while ensuring intimate cold plate or heat sink contact to the microchip, and providing constraints in alignment in the x-, y-, and theta-directions.

It is another object of the present invention to provide an apparatus for attaching a microchip to a cooling device that does not contribute to friction, stiction, or binding during operation.

Still other objects and advantages of the invention will in part be obvious and will in part be apparent from the specification.

SUMMARY OF THE INVENTION

The above and other objects, which will be apparent to those skilled in art, are achieved in the present invention, which is directed to a flexure plate for mounting a cooling device to a microchip comprising: a band having a center aperture, an inner edge and an outer edge; a first set of tabs for mounting, the tabs of the first set connected to the inner edge, inwardly extending with respect to the band, and located opposite one another on the band; and a second set of tabs for mounting, the tabs of the second set located opposite one another on the band such that each tab of the second set is adjacent to each tab of the first set; wherein one set of the tabs is attached to the cooling device and another set of the tabs is attached to a circuit card holding the microchip, such that the microchip is in contact with a surface of the cooling device, and z-directional motion of the circuit card and the cooling device is allowed perpendicular to a plane locating the band. The flexure plate further comprises a one-piece construction. The plate includes mounting holes, studs, pop rivets, adhesive, or spot weld points on each of the tabs for mounting. The second set of tabs may be connected to the inner edge and inwardly extending with respect to the band or connected to the outer edge and outwardly extending with respect to the band. The flexure plate may have non-uniform thickness for the band, the tabs, or both.

In a second aspect, the present invention is directed to an assembly for cooling microchips comprising: a heat sink or cold plate; a flexure plate including a band having a periphery and an inner aperture, a first set of tabs, and a second set of tabs; and a circuit card having a substrate and a microcircuit; wherein the flexure plate includes having each tab of the first set of tabs adjacent each tab of the second set of tabs, the first set of tabs connected to the heat sink or cold plate, and the second set of tabs connected to the circuit card. The assembly further includes thermal paste between the surface of the microchip and the surface of the heat sink or the cooling plate.

In a third aspect, the present invention is directed to flexible mounting bracket for attaching a microchip surface to a cooling device surface that allows for variances in motion perpendicular to the plane of the attached surfaces, the bracket including: a flat rim having an aperture at a center location; at least four mounting tabs including a first set of at least two tabs for mounting the microchip and a second set of at least two tabs for mounting the cooling device, the tabs attached to the rim, the first set of at least two tabs adjacent the second set of at least two tabs.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–9 of the drawings in which like numerals refer to like features of the invention.

Figure 1:
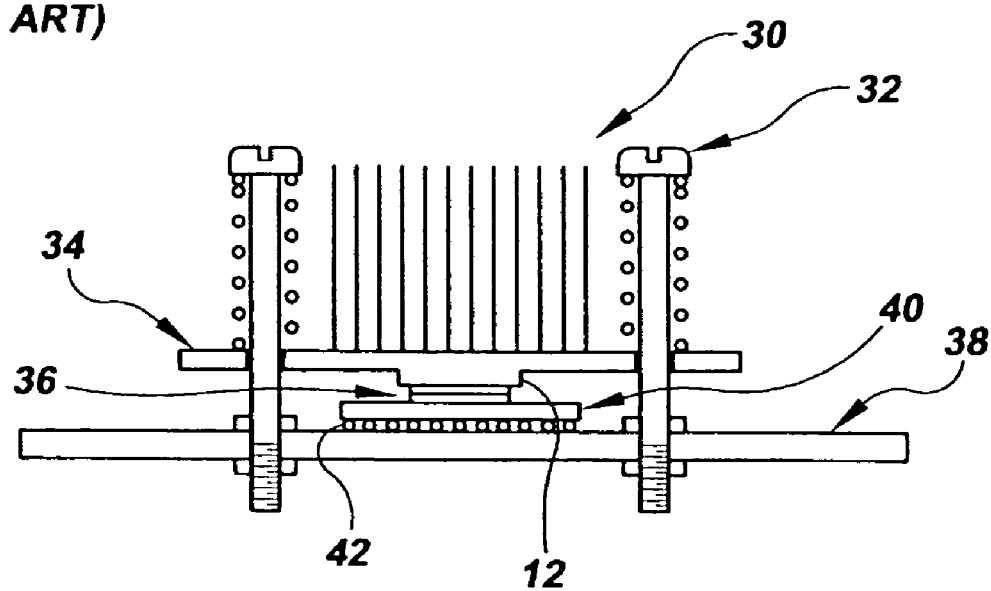
FIG. 1 depicts the four-shaft spring and plunger design of the prior art used for securing a heat sink to a microchip.
Figure 2:
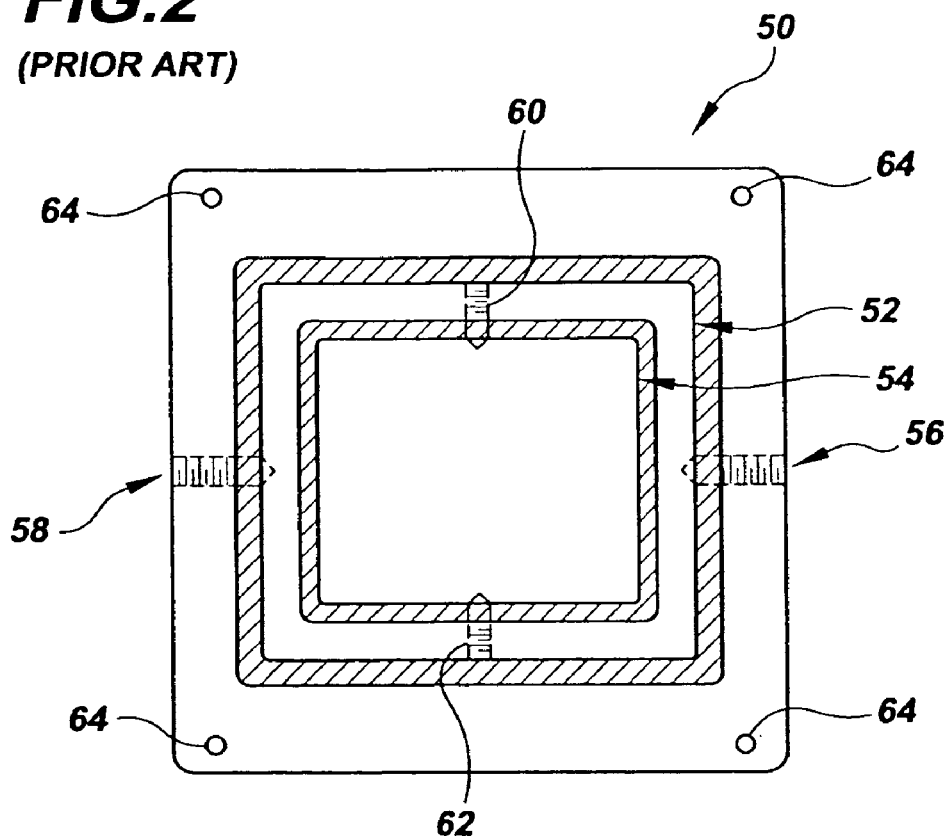
FIG. 2 depicts a classic gimbals design having a ring and an inner plate.

The present invention allows for an attachment of a microchip to a cold plate or heat sink while taking advantage of the similar directional and rotational movements of a classic gimbals design. FIG. 2 depicts a classic gimbals design 50 having a ring 52 and an inner plate 54, with four pivot screws 56, 58, 60, 62. The gimbals generally allow for movement in the pitch and roll directions for a part attached to the inner plate. The gimbals are connected to a mounting frame by pivots 56, 58. Although the classic gimbals design allows for movements to accommodate a tilting surface, it could not be effectively used to support a cooling device while it is attached to a microchip since the design will not allow for z-directional or height variances between the board, cold plate or heat sink, and microchip. Moreover, gimbals mounts normally are prone to loose bearings or friction in the bearings, as well as high manufacturing and maintenance costs, which would make the adoption of this design to semiconductor assembly impractical.

Figure 3:
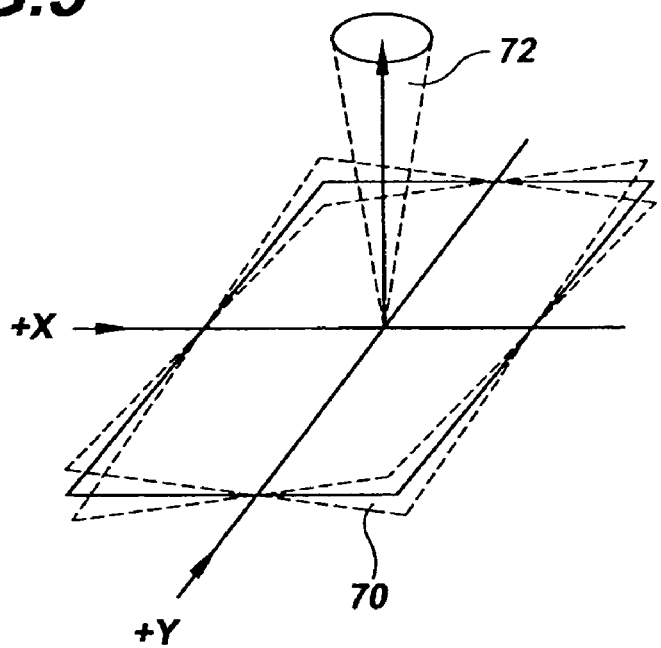
FIG. 3 illustrates the center of rotation with pitch and roll movements that are of concern in the mounting of a microchip to a cooling plate or heat sink.

FIG. 3 illustrates the center of rotation with pitch and roll movements that are of concern in the mounting of a microchip to a cooling plate or heat sink. Plate 70 is shown to rotate about the x-axis and y-axis, which makes the z-vector, normal to the plate surface, sweep out a cone shape 72 during rotation.

Figure 4A:
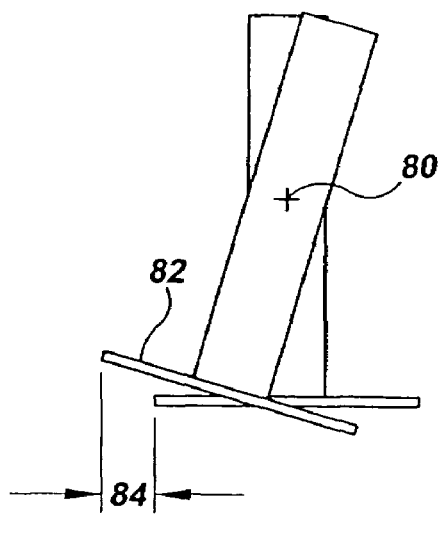
FIG. 4A illustrates the roll center pivot point raised above a plate surface causing a lateral shift.
Figure 4B:
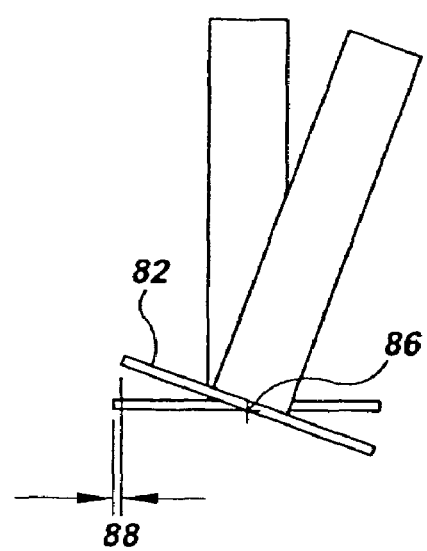
FIG. 4B depicts the roll center of FIG. 4A located at the plate surface for minimum lateral shift.

The present invention reduces the x- and y-directional variations by lowering the pivot for the center roll point. As shown in FIG. 4A, a roll center or pivot point 80 that is raised above the plate surface 82 will cause a large lateral shift 84. Similarly, FIG. 4B depicts a roll center 86, which is located at the plate surface 82. With this lower roll center as the pivot, the lateral shift 88 is much smaller. Thus, a design that provides a low pivot point minimizes lateral shift/sliding as the system corrects for chip tilts.

Figure 5:
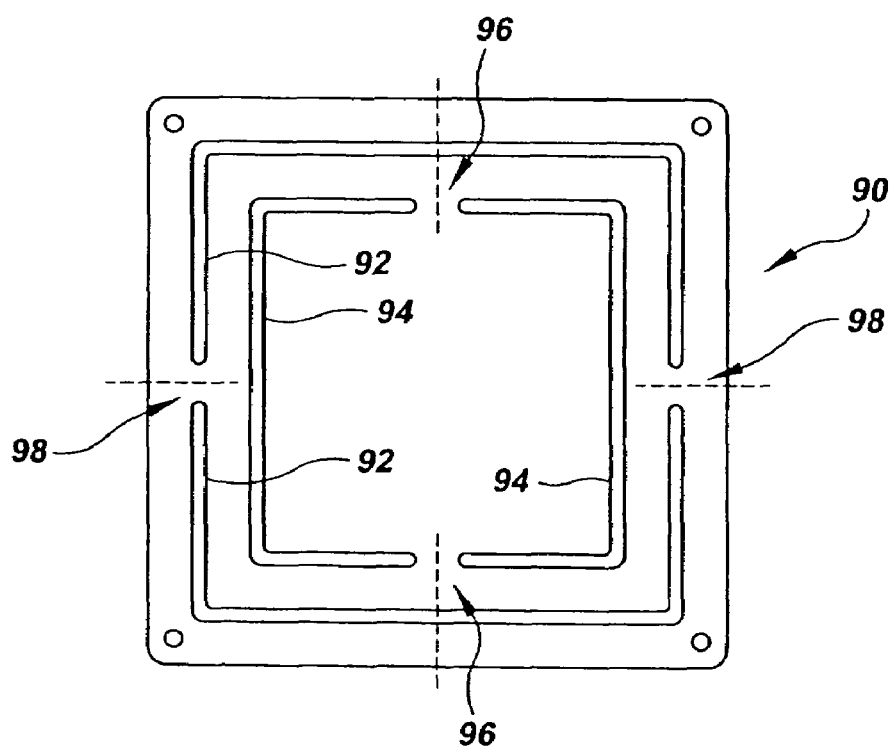
FIG. 5 depicts a flexible sheet metal plate having apertures cut therethrough, which resemble the rings of a gimbals mount.
Figure 6:
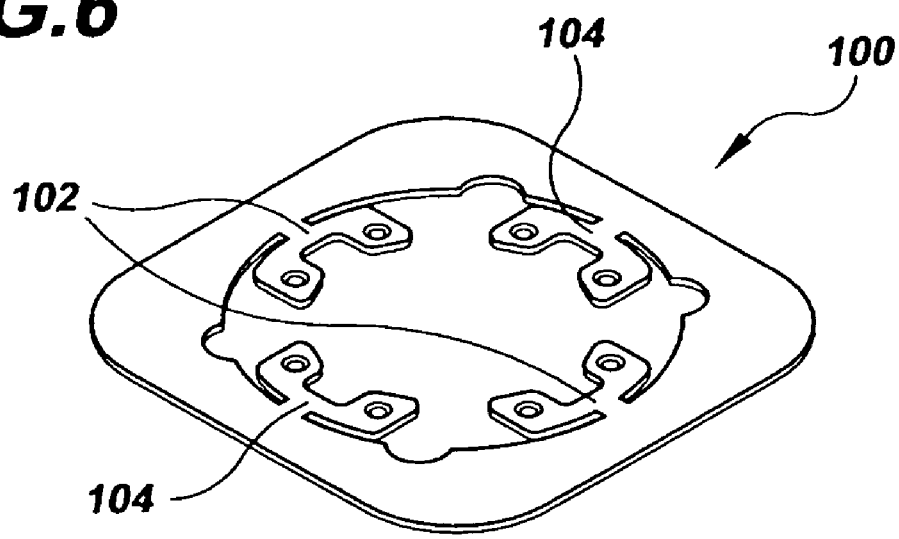
FIG. 6 depicts a novel flexure plate having z-direction compliance when attached to a microchip and heat sink or cold plate.
Figure 7:
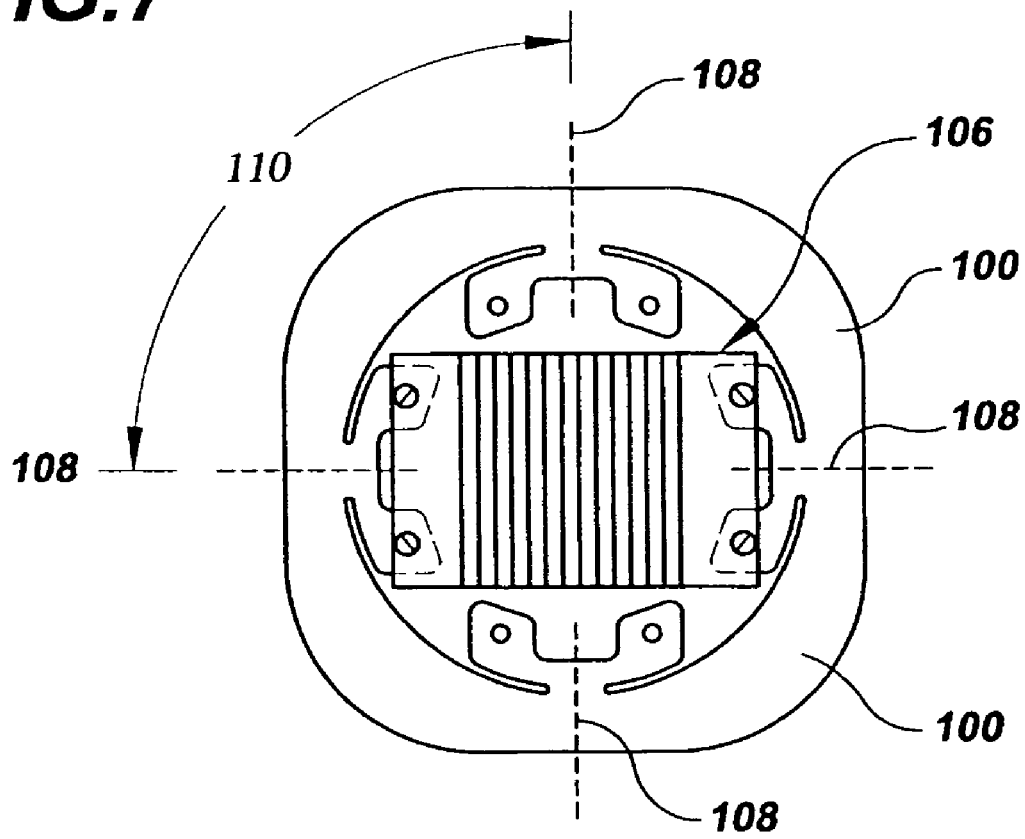
FIG. 7 depicts the flexure plate of FIG. 6 with a heat sink attached.

A flexible plate is introduced that provides a gimbals-type construction and provides a low roll center pivot point. FIG. 5 depicts a flexible sheet metal plate 90 having apertures 92, 94 cut therethrough which act to some extent as the rings of a gimbals mount. Flexure pivot points 96, 98 are defined by the spacing between the apertures rings. In a similar manner to a gimbals mount, each flexure pivot point 96 allows for movement in a plane perpendicular to the movement allowed by flexure pivot points 98. The present invention uses this design as a mounting fixture to mount the circuit card holding the semiconductor substrate and microchip to the heat sink or cold plate. One set of pivots is directed to the circuit card, and the other set of pivots is directed to the heat sink or cold plate. However, the flexure plate, as depicted, would not easily fit within the existing mechanical constraints of a cold plate/microchip mount, and offers only slight z-direction compliance. Although this flexure plate may be used in the mounting design, a preferred plate would include further z-direction compliance movement to accommodate variation in stack heights of various structures. In FIG. 6, the novel flexure plate 100 with z-direction compliance is illustrated. Tabs 102 are used to mount a cold plate or heat sink, while tabs 104 are used to mount the circuit card or base plate holding the semiconductor substrate and microchip. The flexibility of the plate allows tabs 102 to be extremely z-direction compliant to the movement of tabs 104. FIG. 7 depicts the flexure plate 100 of FIG. 7 with a heat sink 106 attached. Pivot points 108 are shown at the center of each tab. The flexure length 110 is the distance from one heat sink tab 102 to the adjacent base plate tab 104. The flexure length allows for the z-direction compliance and provides the limiting factor in z-direction movement. Compliance is achieved by selectively mounting two of the tabs to the cold plate or heat sink and the remaining two tabs to the base plate or circuit card. The freedom of motion in the z-direction is achieved by mounting one part of the flexure plate to the surface of the base plate and the other to the heat sink/cold plate. Preferably at least two millimeters of z-direction variance will be allowed between the two mating structures, although other distances will work as well in this design. Spring and compliance rates, as well as x-, y-, and theta stiffness, may be optimized through flexure width variations and flexure material selection.

Figure 8:
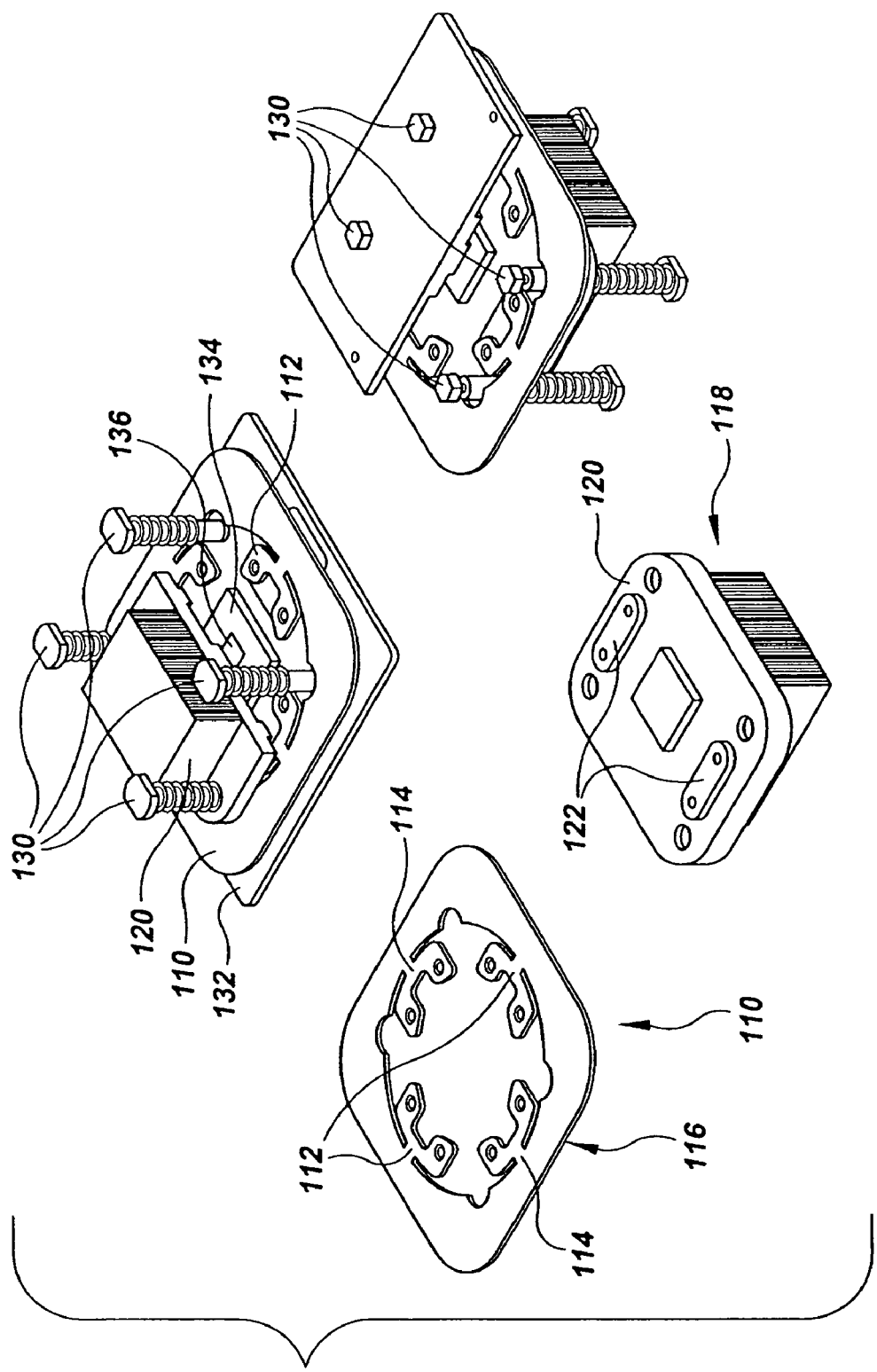
FIG. 8 depicts a flexure plate having tabs on the inside of the flexure plate ring.

FIG. 8 shows a preferred embodiment assembly of the present invention. The flex plate 110 is shown with card mount tabs 112 and heat sink mount tabs 114. The tabs are shown with mounting holes; however, other mechanical mounting schemes may be used, such as studs, pop rivets, adhesives, clips, and spot welding points, to name a few. Both sets of tabs are inwardly facing with respect to the flex plate outer ring. The pivot points 116 under flexion, twisting, and torsion are most effective at the center of the tabs. The heat sink 118 has a base plate 120 with mounting bosses 122 for attaching tabs 114. Preferably, flat head mounting screws are used to make this attachment. Once the heat sink is attached to the flex plate, the card mounting tabs 112 are used to mount the circuit card 132 holding the substrate 134 and microchip 136 to the flex plate. Plunger mounting screws 130 facilitate applying pressure to the heat sink against the microchip. The circuit card 132 is mounted through the card mount tabs 112. Other mounting schemes may be considered provided that the flex plate retains its predetermined degrees of freedom for maximum z-direction compliance between the mounted heat sink and the mounted circuit board. The flex plate may be manufactured in a number of ways, such as by laser cut, EDM, water jet, punch, CNC mill, or the like. In the preferred embodiment, the flex plate is fabricated from ¾ hard 304 stainless steel, approximately in the range of 0.010 to 0.062 inches thick. However, parts do not have to be made out of sheet metal. The flex plate may also be fabricated from plastic or metal castings, and have either uniform or non-uniform thickness. With proper variation in design, thicker flex plates can provide for pressures on the order of 25 to 250 psi without requiring springs in the assembly.

Figure 9:
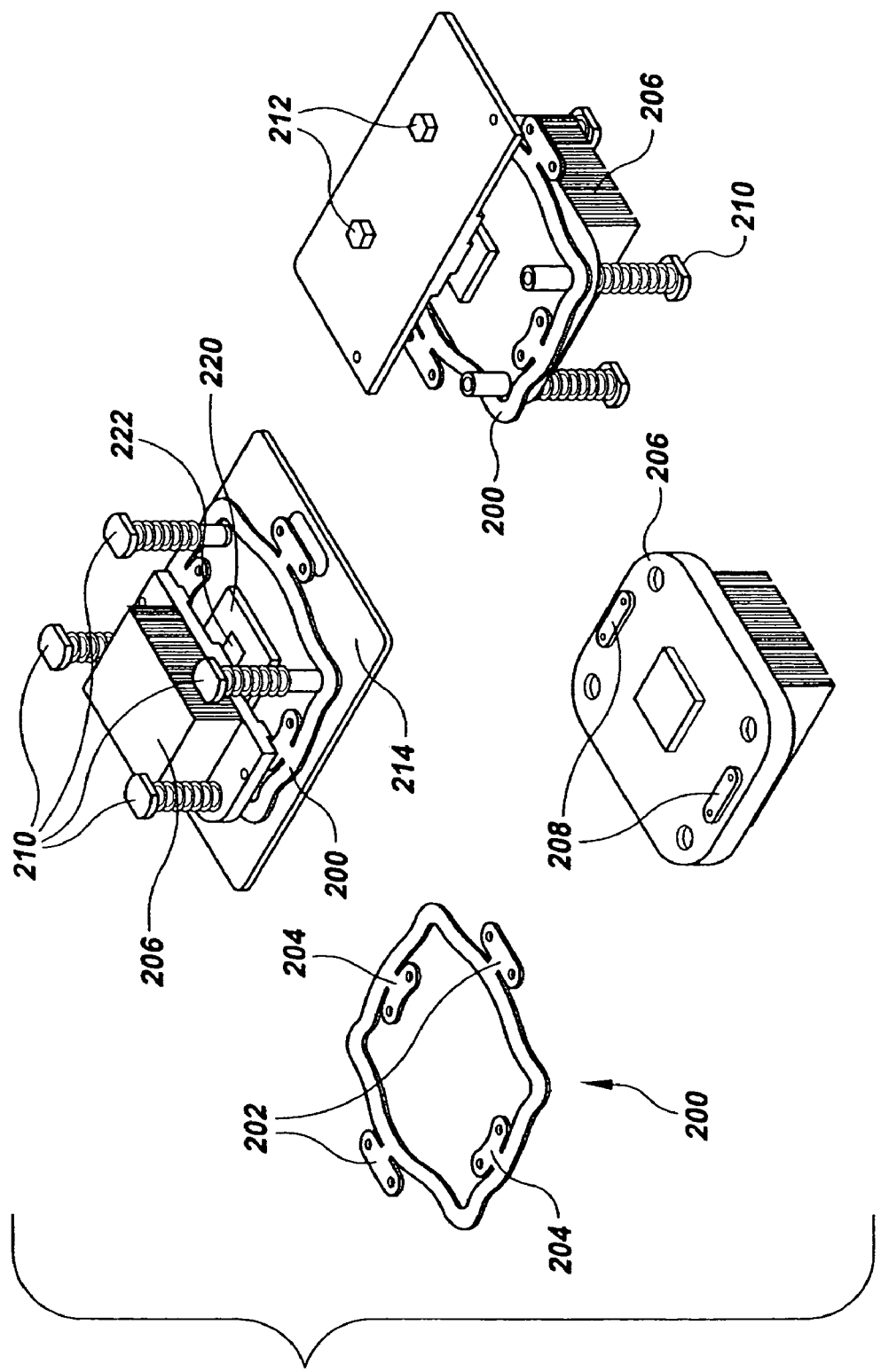
FIG. 9 depicts an alternative embodiment of the flexure plate of the present invention, having one set of tabs on the outside of the flexure plate ring.

FIG. 9 depicts an alternative embodiment of the flex plate of the present invention. Flex plate 200 is shown with outwardly facing card mount tabs 202 and inwardly facing heat sink/cold plate mount tabs 204. The inwardly facing heat sink tabs 204 mount to bosses 208 on the heat sink 206. Spring posts 210 are used to apply pressure to the circuit card and heat sink interface at the microchip surface. Once the heat sink is attached to the flex plate, the card mounting tabs 202 are used to mount the circuit card 214 holding the substrate 220 and microchip 222 to the flex plate 200. Similar to the first embodiment, plunger-mounting screws 210 facilitate applying pressure to the heat sink against the microchip.

The flex plate allows the plane of rotation to be at the microchip-heat sink assembly. The z-direction compliance is preferably at least 1 to 2 millimeters to accommodate variations in the microchip thickness, circuit board, and heat sink heights. A pitch and roll compliance of approximately +/−2 degrees is preferred to accommodate variations in the microchip, circuit card, and heat sink tilt. The flex plate design also yields rigid placement in the x-, y-, and theta-directions, eliminating sliding and twisting at the interface. Because the flexure is a single, solid piece, there is no looseness or slop in this type of bearing design. Friction and binding are eliminated by the one-piece flex plate design. Furthermore, the low mass of the flex plate minimizes its impact in shock and vibration environments. The flex plate is much easier to manufacture than the current mounting schemes, and requires fewer tight tolerances for manufacturing than would be required for sliding members such as bushings, bearings, and the like. The flex plate has a lower profile, making it easier to fit in place where there are significant mechanical restraints. The balanced, symmetrical design may be used as a loading spring with uniform compliance in the pitch and roll directions. Importantly, the long flexure arms result in large z-direction compliance while fitting in a small mounting footprint.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A flexure plate for mounting a cooling device to a microchip comprising:
   a band having a center aperture, an inner edge and an outer edge;
   a first set of tabs for mounting, said tabs of said first set connected to said inner edge, inwardly extending with respect to said band, and located opposite one another on said band; and
   a second set of tabs for mounting, said tabs of said second set located opposite one another on said band such that each tab of said second set is adjacent to each tab of said first set;
   wherein one set of said tabs is attached to said cooling device and another set of said tabs is attached to a structure holding said microchip, such that said microchip is in contact with a surface of said cooling device, and z-directional motion of said structure holding said microchip and said cooling device is allowed perpendicular to a plane locating said band.

2. The flexure plate of claim 1 further comprising a one-piece construction.

3. The flexure plate of claim 1 wherein said first and second set of tabs include y-shaped tabs, each connected to said band of said flexure plate at a base of each of said y-shaped tabs.

4. The flexure plate of claim 1 including mounting holes, studs, pop rivets, adhesive, or spot weld points on each of said tabs for mounting.

5. The flexure plate of claim 1 including said second set of tabs connected to said inner edge and inwardly extending with respect to said band.

6. The flexure plate of claim 1 including said second set of tabs connected to said outer edge and outwardly extending with respect to said band.

7. The flexure plate of claim 3 including two mounting holes for each of said y-shaped tab located at each end opposite said y-shaped tab base.

8. The flexure plate of claim 2 including said one-piece construction manufactured by laser cut, EDM, water jet, punch, or CNC mill.

9. The flexure plate of claim 1 including having said flexure plate made from sheet metal, plastic or metal castings.

10. The flexure plate of claim 9 further comprising ¾ hard 304 stainless steel.

11. The flexure plate of claim 1 further comprising having non-uniform thickness for said band, said tabs, or both.

12. An assembly for cooling microchips comprising:
    a heat sink or cold plate;
    a flexure plate including a band having a periphery and an inner aperture, a first set of mounting tabs, and a second set of mounting tabs; and
    a circuit card having a substrate and a microcircuit;
    wherein said flexure plate includes having each mounting tab of said first set of tabs adjacent each mounting tab of said second set of tabs, said first set of mounting tabs attached to said heat sink or cold plate, and said second set of mounting tabs attached to said circuit card.

13. The assembly of claim 12 further comprising spring-loaded screws for attaching said circuit card to a chassis.

14. The assembly of claim 12 including having a surface of said heat sink or cold plate mate to a surface of said microchip, such that said surfaces remain in contact after said heat sink or cold plate and said circuit card are attached to said flexure plate.

15. The assembly of claim 14 further including thermal paste between said surface of said microchip and said surface of said heat sink or said cooling plate.

16. The assembly of claim 12 including said second set of tabs inwardly extending within said aperture.

17. The assembly of claim 12 including said second set of tabs outwardly extending with respect to said band, away from said aperture.

18. A flexible mounting bracket for attaching a microchip surface to a cooling device surface that allows for variances in motion perpendicular to the plane of the attached surfaces, said bracket including:
   a flat rim having an aperture at a center location;
   at least four mounting tabs including a first set of at least two tabs for mounting to a circuit card holding said microchip and a second set of at least two tabs for mounting said cooling device, said tabs attached to said rim, said first set of at least two tabs adjacent said second set of at least two tabs.

19. The flexible mounting bracket of claim 18 wherein both of said sets of said at least two tabs face inward toward said rim center location.

20. The flexible mounting bracket of claim 18 wherein one of said sets of said at least two tabs are located on the inside of said rim while the other of said sets of said at least two tabs are located on the outside of said rim.

21. An assembly for cooling microchips comprising:
   a heat sink or cold plate;
   a flexure plate including a band having a periphery and an inner aperture, a first set of tabs, and a second set of tabs; and
   a circuit card having a substrate and a microcircuit;
   wherein said flexure plate includes having each tab of said first set of tabs adjacent each tab of said second set of tabs, said first set of tabs connected to said heat sink or cold plate, and said second set of tabs connected to said circuit card, said second set of tabs inwardly extending within said aperture.

* * * * *